(12) United States Patent
Zhang

(10) Patent No.: US 7,967,628 B2
(45) Date of Patent: Jun. 28, 2011

(54) ELECTRICAL CONNECTOR WITH REDUCED STRESS BETWEEN CONTACTS AND HOUSING

(75) Inventor: Jie-Feng Zhang, ShenZhen (CN)

(73) Assignee: Hon Hai Precision Ind. Co., Ltd., New Taipei (TW)

( * ) Notice: Subject to any disclaimer, the term of this patent is extended or adjusted under 35 U.S.C. 154(b) by 120 days.

(21) Appl. No.: 12/286,707

(22) Filed: Sep. 30, 2008

(65) Prior Publication Data
US 2009/0124102 A1     May 14, 2009

(30) Foreign Application Priority Data

Nov. 9, 2007   (CN) .......................... 2007 2 0042137

(51) Int. Cl.
*H01R 9/24* (2006.01)
(52) U.S. Cl. ....................................................... 439/342
(58) Field of Classification Search ................... 439/342, 439/733.1, 876, 884, 856, 857, 347
See application file for complete search history.

(56) References Cited

U.S. PATENT DOCUMENTS

| 6,908,328 | B2 | 6/2005 | Lei et al. | |
|---|---|---|---|---|
| 7,052,289 | B1 * | 5/2006 | Hao | ................................ 439/83 |
| 2003/0092304 | A1 * | 5/2003 | Whyne et al. | ................. 439/342 |

* cited by examiner

*Primary Examiner* — Alexander Gilman
(74) *Attorney, Agent, or Firm* — Andrew C. Cheng; Wei Te Chung; Ming Chieh Chang

(57) ABSTRACT

A conductive contact (1) used for an electrical connector comprises a vertical base portion (10) defining a front surface (103) and a rear surface (101) opposite to each other in a thickness direction, the base portion (10) having at least one fastening slot (102) on the rear surface (101) thereof for securing the conductive contact (1) in an insulative housing of the electrical connector (100), a tail portion (12) located below said base portion (10) for mounting to a printed circuit board, an extension (13) located above said base portion (10), and a pair of arm portions (11) extending slantingly from opposite edges of the extension (13) in an upward direction.

10 Claims, 4 Drawing Sheets

ELECTRICAL CONNECTOR WITH REDUCED STRESS BETWEEN CONTACTS AND HOUSING

BACKGROUND OF THE INVENTION

1. Field of the Invention

The present invention relates to a Zero Insertion Force (ZIF) socket type electrical connector, and particularly to an electrical connector having a plurality of reliable conductive contacts for electrically connecting an electronic package, such as a central processing unit (CPU), with a circuit substrate, such as a printed circuit board (PCB). The conductive contact defines at least one fastening slots on a rear surface thereof for firmly securing the conductive contact to a base of the electrical connector and reducing stress between the conductive contact and the base.

2. Description of the Prior Art

Zero Insertion Force (ZIF) socket type electrical connectors have been widely used in connecting electronic devices, such as a central processing unit (CPU) package to a printed circuit board.

A conventional Zero Insertion Force (ZIF) electrical connector generally comprises a base, a cover assembled on the base and a plurality of electrical terminals received in the base. The base defines a number of passageways for receiving the electrical terminals. Each electrical terminal defines a base portion, a pair of touching pads extending from two sides of the base portion for contacting with a corresponding pin of the central processing unit (CPU) package, and a soldering pad extending from a bottom end of the base portion and being opposite to the touching pad. When the central processing unit (CPU) package is mounted on the Zero Insertion Force (ZIF) electrical connector and is pressed, each pin contacts the corresponding pair of touching pads of the electrical terminal. Accordingly, the central processing unit (CPU) package is electrically connected to the printed circuit board (PCB).

Furthermore, U.S. Pat. No. 6,908,328, issued to Lei on Jun. 21, 2005 discloses a connector for electrically connecting a central processing unit (CPU) with a print circuit board (PCB). The connector includes an insulative housing, a plurality of passageways defined in the housing, and a plurality of conductive contacts secured in corresponding passageways. Each passageway includes a fastening recess. Each contact includes a soldering portion for being soldered to the PCB, a pair of contact portions for engaging with the CPU, and a body portion interconnecting the soldering portion and the contact portions. Two pairs of engaging portions are formed on opposite lateral edges of the body portion respectively. Each engaging portion includes an upper fixing part and a lower tapered guiding part. When the contact is finally fixed in its corresponding passageway, two opposite faces of the fixing parts interferentially press and engage with the fastening recess of corresponding side walls of the insulative housing. Thus the contact is secured in the passageway of the insulative housing.

Generally, the contact is secured in the passage of the insulative housing by the engaging portions defined on opposite lateral edges of the body portion engaging with the side wall of the passage. Unfortunately, there will be a large interference force on the insulative housing in a transverse direction. And thus, there is a possibility that the insulative housing is likely to produce a warp in the transversal direction. In the worst scenario, the whole connector will be malfunctioned and has a poor electrical connection.

In view of the above, a new electrical connector that overcomes the above-mentioned disadvantages is desired.

SUMMARY OF THE INVENTION

Accordingly, an object of the present invention is to provide an electrical connector that has a plurality of conductive contacts reliably and electrically connecting an electronic package such as a central processing unit (CPU) with a circuit substrate such as a printed circuit board (PCB).

Another object of the present invention is to provide a conductive contact can be firmly secured in a base of the electrical connector. In addition, the fixing force stressing on the base can be balanced and reduced the warp of the base of the electrical connector can be properly eliminated and softened.

To fulfill the above-mentioned objects, an improved electrical connector is provided to resolve the disadvantages described above. The electrical connector made in accordance with the present invention for electrically connecting a central processing unit with a printed circuit board, comprises a base assembled with a plurality of conductive contacts, a cover movably mounted on the base, an actuator received between the base and the cover. The base defines a plurality of passageways therein for receiving the correspondingly conductive contacts. The actuator can move between an open position and a closed position. Each conductive contact comprises a base portion, a tail portion located below said base portion for mounting to a printed circuit board, an extension located above said base portion and a pair of arm portions. The vertical base portion defines a front surface and a rear surface opposite to each other in a thickness direction. The base defines at least one fastening slots on the rear surface thereof for firmly securing the conductive contact to the base of the electrical connector and reducing stress between the conductive contact and the base. The pair of arm portions extends slantingly from opposite edges of the extension in an upward direction.

Other objects, advantages and novel features of the invention will become more apparent from the following detailed description when taken in conjunction with the accompanying drawings, in which:

DETAILED DESCRIPTION OF THE INVENTION

Figure 1:
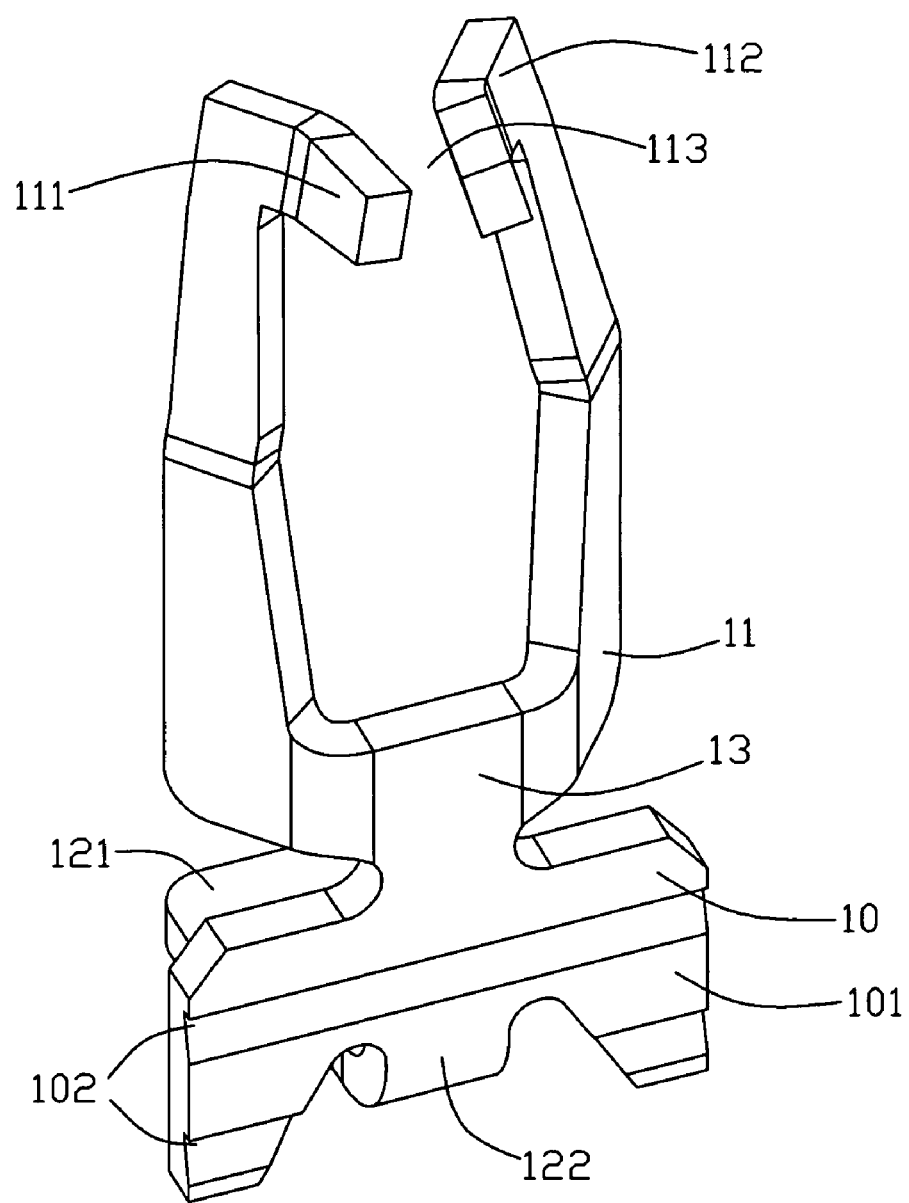
FIG. 1 is an isometric view of a conductive contact in accordance with the preferred embodiment of the present invention.
Figure 2:
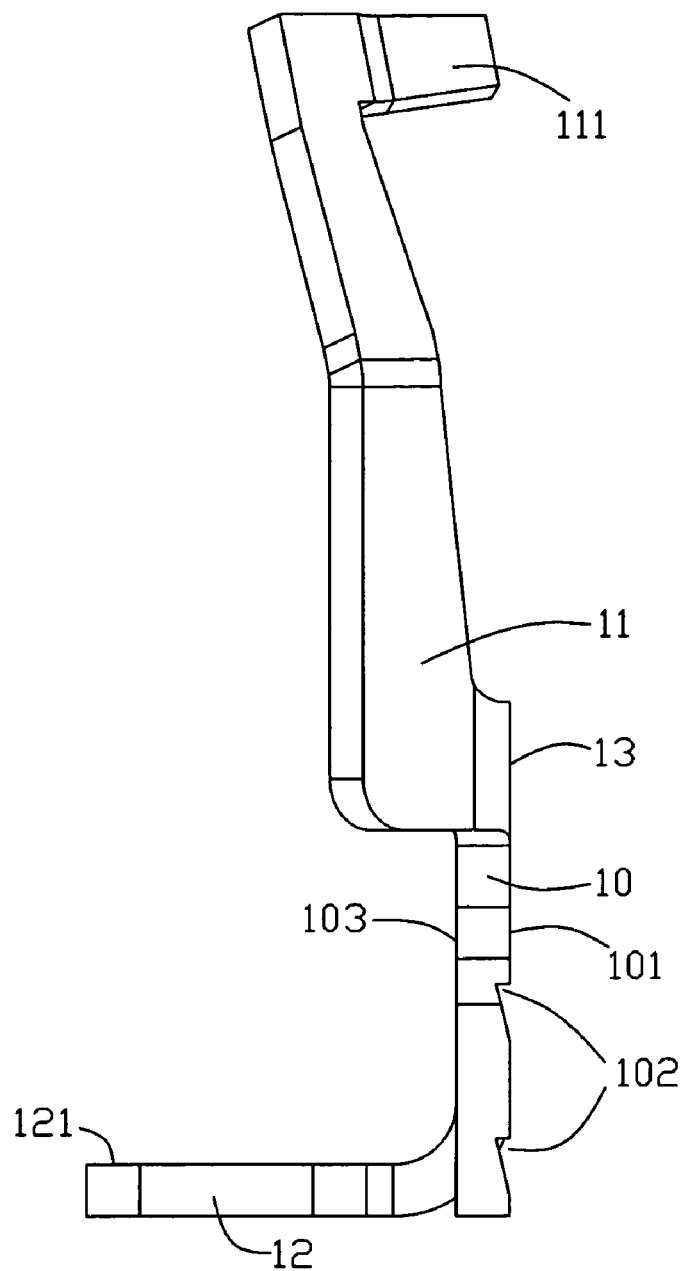
FIG. 2 is a side view of the conductive contact shown in FIG. 1.

Reference will now be made to the drawings to describe the present invention in detail.

Referring to FIGS. 1-4, an electrical connector 100 in accordance with a preferred embodiment of the present invention is used for electrically connecting an electronic package such as a central processing unit (CPU) (not shown), with a circuit substrate such as a printed circuit board (PCB) (not shown). The electrical connector 100 comprises a base 2 assembled with a plurality of conductive contacts 1, a cover 3 and an actuator 4. The base 2 defines a multiplicity of passageways 22 for receiving correspondingly conductive contacts 1 therein. The cover 3 can be movably mounted on the base 2. The actuator 4 is received between the base 2 and the cover 3 and used to actuate the cover 3 to move on the base 2 from an open position to a closed position.

Figure 3:
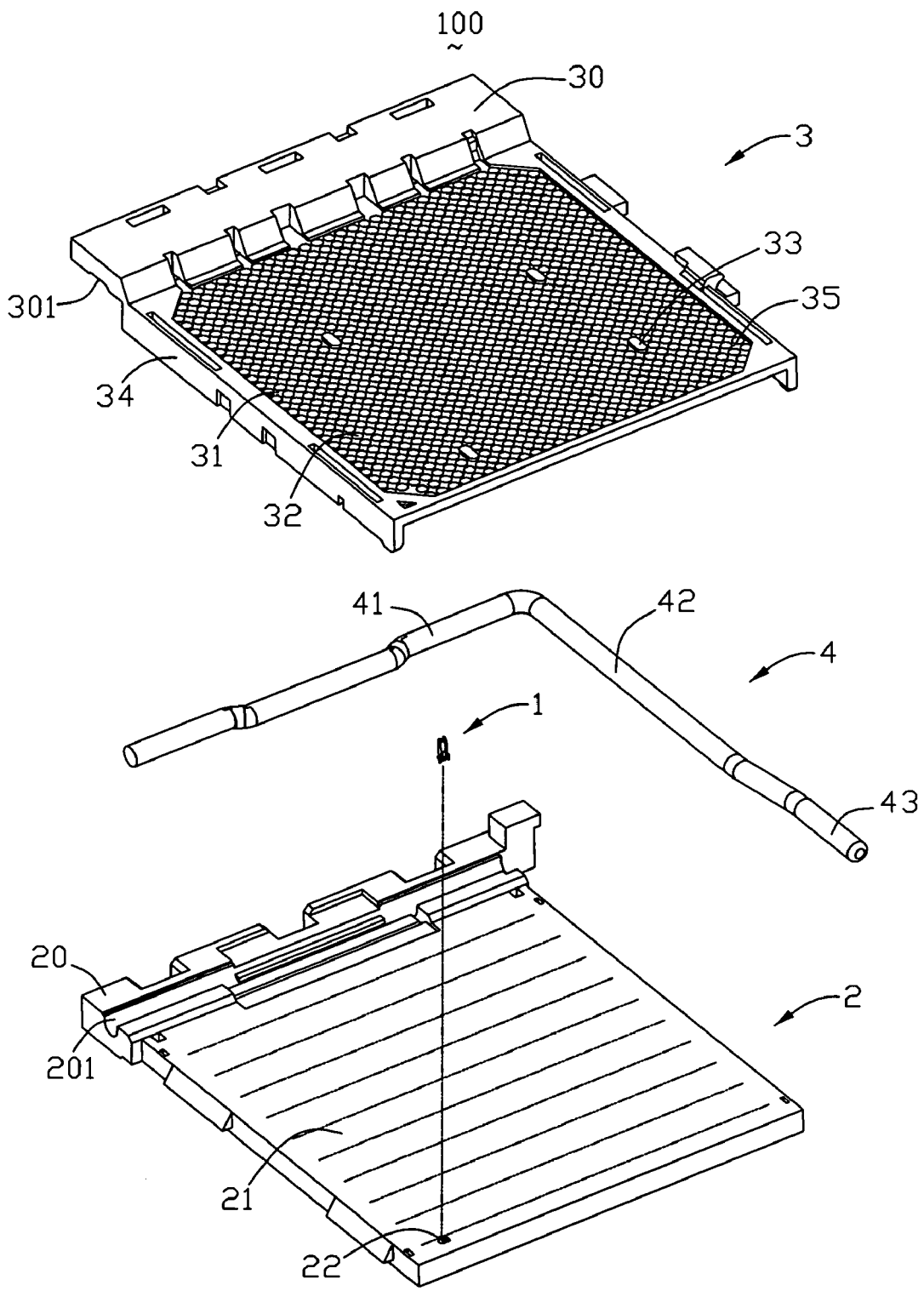
FIG. 3 is an exploded, isometric view of an electrical connector with the conductive contact in accordance with the preferred embodiment of the present invention.

Referring to FIG. 3, the base 2 includes a head portion 20 for receiving the actuator 4 and a receiving portion 21 adjacent to the head portion 20. The head portion 20 is higher than the receiving portion 21 and defines a slot 201 for receiving the actuator 4. The receiving portion 21 defines a multiplicity of the passageways 22 there through, for receiving a corresponding number of the conductive contacts 1 therein.

Referring to FIG. 3, the cover 3 is formed from a dielectric material by insert molding. The cover 3 includes a projecting portion 30 defining a groove 301 corresponding to the slot 201 of the head portion 20 of the base 2 and a supporting portion 31 corresponding to the receiving portion 21 of the base 2 for supporting the CPU (not shown). The supporting portion 31 defines a plurality of through holes 32 corresponding to the passageways 22 of the base 2 for insertion of the pins (not shown) of the CPU (not shown). A top surface 35 of the supporting portion 31 defines some protrusions 33 for supporting the CPU (not shown). A pair of sidewalls 34 extending downwardly from the supporting portion 31 for latching on the base 2.

Figure 4:
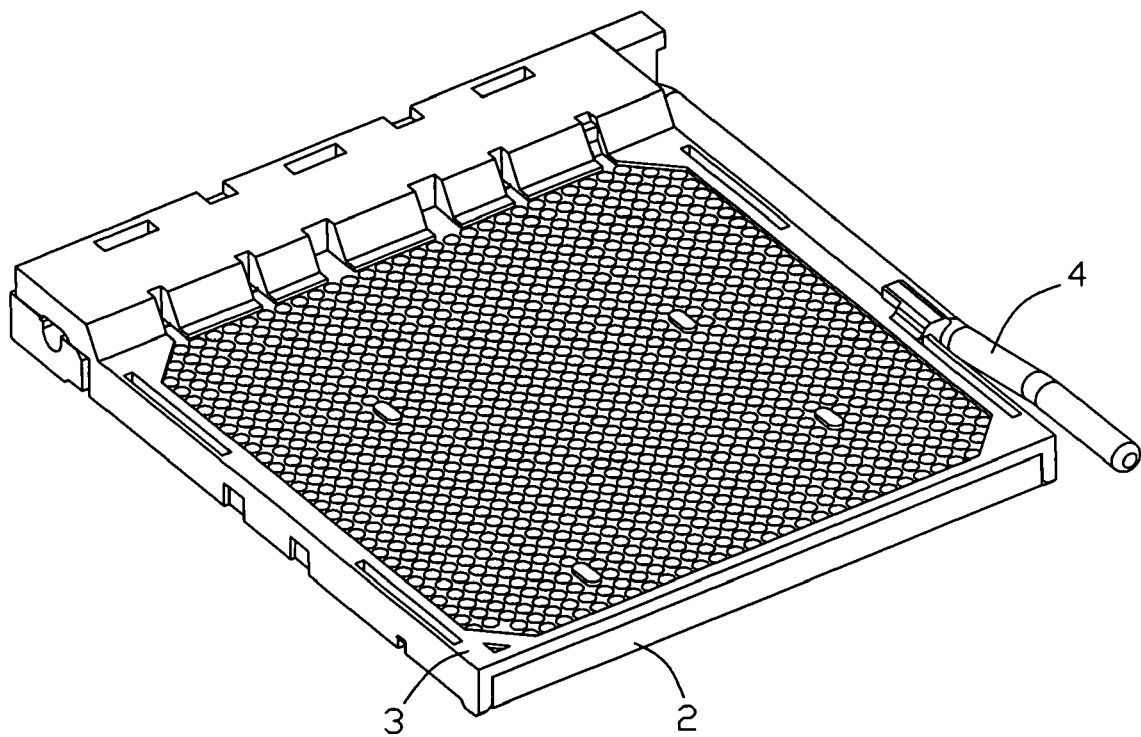
FIG. 4 is an assembled, isometric view of the electrical connector shown in FIG. 3.

Referring to FIGS. 3-4, the actuator 4 in the preferred embodiment is a lever. The actuator 4 comprises a loading lever 41 received between the slot 201 defined on the base 2 and the groove 301 defined on the cover 3, and a handle 43 extending perpendicularly from an end of the loading lever 41. The actuator 4 could be in any other forms, as is known to one of ordinary skill in the pertinent art, used in all kinds of ZIF socket connectors, for example a cam extending in corners of the base and the cover, on the only condition that it can be manipulated to move the cover with respect to the base in use.

Each conductive contact 1 is made by stamping a metal plate and followed by subsequent forming operations. The conductive contact 1 comprises a base portion 10, an extension 13 is formed on an upper end of the base portion 10, and a pair of arm portions 11 extending slantingly from opposite edges of the extension 13 in an upward direction, and a tail portion 12 extending from a lower end of the base portion 10.

The base portion 10 defines a front surface 103 and a rear surface 101 opposite to each other in a thickness direction. The rear surface 101 of the base portion 10 is faced to an inner surface of the passageway 22 when the conductive contact 1 is assembled in the base 2. Two fastening slots 102 are defined on the rear surface 101 for engaging with the inner sidewall (not labeled) of the passageway 22 to secure the conductive contact 1 in the base 2. The two fastening slots 102 are approximately in a parallel in an up and down direction. Each fastening slot 102 is a triangle flume in a side view. When the conductive contact 1 is assembled in the passageway 22 of the base 2, the base portion 10 interferes with the inner sidewall (not labeled) of the passageway 22. At this time, part of the inner sidewall (not labeled) of the passageway 22 having a distortion is received in the fastening slots 102, and the rear surface 101 of the base portion 10 snugly engages with the inner sidewall (not labeled) of the passageway 22. And thus the conductive contact 1 is firmly and reliably secured in the passageway 22 of the base 2.

The fastening slots 102 on the rear surface 101 of the base portion 10 can engage with the passageway 22 when the conductive contact 1 is inserted into the base 2. The fastening slots 102 can provide a fixing force not only in a vertical direction but also in a horizontal direction. Thus the fastening slots 102 provide a reliable fixing function, and the conductive contact 1 is firmly secured in the passageway 22 of the base 2. At the same time, it could avoid the warp of the base 2 because the force stressing on the base 2 is balanceable.

Each arm portion 11 has a contacting portion 112 at a top end of thereof and a distal portion 111 extending from the contacting portion 112 for electrical connecting with a pin (not shown) of the CPU (not shown). The contacting portions 112 are spaced from each other and are arranged to converge toward each other whereby a distance between the contacting portions 112 is reduced to a minimum gap 113 between the distal portions 111. The convergent configuration of the contacting portions 112 functions to lead the pin (not shown) of the CPU (not shown) into the gap 113 between the distal portions 111. The angularly offset arm portions 11 allows flexibility in setting and adjusting performance parameters of the conductive contact 1, such as the gap 113 between the distal portion 111 and the spring rate of the arm portions 11 and the contacting portions 112 experienced by the pins (not shown) of the CPU (not shown).

The tail portion 12 comprises a solder pad 121 connected to the lower end of the base portion 10 by a neck portion 122. The neck portion 122 is bent an angle of approximately 90 degrees. The solder pad 121 can carry a solder ball (not shown) for connecting the conductive contact 1 to the printed circuit board PCB (not shown) by Surface Mount Technology (SMT). However, that is well known and no further description is necessary herein.

When the electrical connector 100 at an opening position, the CPU (not shown) is initially disposed on the cover 3 and the pins (not shown) of the CPU (not shown) extend through the through holes 32 of the cover 3 into the passageways 22 of the base 2 without electrically contacting with the electrical contacts 1. When the electrical connector 100 at a closed position, the pins (not shown) of the CPU (not shown) received in the gap (not labeled) between the distal portions 111 and engaging with the distal portions 111 of the conductive contact 1. Thus it realizes a reliable electrical connection between the CPU (not shown) and a print circuit board (PCB).

The conductive contact 1 defines a pair of fastening slots 102 on the rear surface 101 of the base portion 10 at a thickness direction for engaging with the inner sidewall (not labeled) of the passageway 22 when the conductive contact 1 is inserted into the base 2. Thus the conductive contact 1 can be firmly secured in the passageway 22 of the base 2. The rear surface 101 of the base portion 10 of the conductive contact 1 engages with the inner sidewall (not labeled) passageway 22 to avoid the conductive contact 1 to rock in the passageway 22 of the base 2. In addition, the fixing force stressing on the base 2 can be balanced, so the warp of the base 2 can be avoided. Thus the electrical connector 100 can realize a reliable electrical connection between the CPU (not shown) and the print circuit board (PCB) (not shown).

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A conductive contact for used for an electrical connector, comprising:

a base portion defining a front surface and a rear surface opposite to each other in a thickness direction, the base portion having at least one fastening slot on the rear surface thereof, and the at least one fastening slot which is not running through the base portion in the thickness direction for securing the conductive contact to an insulative housing of the electrical connector;

a tail portion located below said base portion for mounting to a printed circuit board;

an extension located above said base portion; and a pair of arm portions extending slantingly from two opposite edges of the extension in an upward direction; wherein the at least one fastening slot there are two fastening slots, each fastening slot extends through the base portion in a horizontal direction to arrive two lateral edges of the base portion connecting the front surface and the rear surface.

2. The conductive contact as claimed in claim 1, wherein the two fastening slots are approximately parallel in the horizontal direction.

3. The conductive contact as claimed in claim 1, wherein a section of the fastening slot is a triangle flume, a top inner surface is located in a horizontal plane.

4. The conductive contact as claimed in claim 1, wherein each arm portion has a contacting portion at a top end thereof and a distal portion extending from the contacting portion for electrically connecting with a pin of the central processing unit.

5. The conductive contact as claimed in claim 4, wherein the contacting portions are spaced from each other and are arranged to converge toward each other, whereby a distance between the contacting portions is reduced to a minimum gap between the distal portions.

6. An electrical connector comprising:

an insulative housing defining a plurality of passageways each formed by a plurality of circumferential walls;

a plurality of contacts disposed in the corresponding passageways, respectively, each of said contacts including:

a planar thin vertical base portion defining opposite front and rear main faces thereof, said rear main face being forcibly intimately engaging a selected one of said circumferential walls;

a resilient contacting portion extending from the base portion and facing the front main face while opposite to said rear main face for engagement with an conductive pin of an electronic package; and a solder portion extending from the base portion and facing the front main face while opposite to the rear main face for coupling to a solder ball; wherein the rear main face defines at least a horizontal slot receiving therein a deformed portion of the housing on said selected one of the circumferential walls so as to relieve warpage stress of the housing.

7. The electrical connector as claimed in claim 6, wherein said horizontal slot extends throughout both two opposite side edges of the base portion.

8. The electrical connector as claimed in claim 7, wherein each of said side edges is flat in a vertical direction.

9. The electrical connector as claimed in claim 7, wherein the contact includes an extension extending upwardly from the base portion, a pair of arm portions extending slantingly from opposite sides of the extension, and each of said arm portions includes a lower half upwardly extending vertically and an upper half upwardly extending obliquely away from the base portion toward the other arm portion.

10. The electrical connector as claimed in claim 7, wherein each of said arm portions includes a contacting portion at a top end thereof, and a distal portion extending from the contacting portion for engagement with the corresponding conductive pin, and said distal portion extends toward but not beyond the base portion in a top view.

* * * * *